(12) United States Patent
Siegmund

(10) Patent No.: US 8,612,898 B1
(45) Date of Patent: Dec. 17, 2013

(54) IDENTIFICATION OF ILLEGAL DEVICES USING CONTACT MAPPING

(75) Inventor: Robert Siegmund, Tegau (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 13/585,152

(22) Filed: Aug. 14, 2012

(51) Int. Cl.
*G06F 17/50* (2006.01)

(52) U.S. Cl.
USPC ............................... 716/50; 716/136

(58) Field of Classification Search
None
See application file for complete search history.

(56) References Cited

U.S. PATENT DOCUMENTS

| 6,594,799 | B1 * | 7/2003 | Robertson et al. | 716/100 |
| 6,851,094 | B1 * | 2/2005 | Robertson et al. | 716/129 |
| 7,340,697 | B2 * | 3/2008 | Boshart et al. | 716/103 |

OTHER PUBLICATIONS

Leibiger, Steven, "A Semiconductor Valid Device Development Production Control Methodology," 2003 IEEE/SEMI Advanced Manufacturing Conference, pp. 280-285.*

* cited by examiner

*Primary Examiner* — Leigh Garbowski
(74) *Attorney, Agent, or Firm* — Williams, Morgan & Amerson, P.C.

(57) ABSTRACT

A method includes receiving a device layout file in a computing apparatus defining a plurality of device structures in a semiconductor device. A foundry truth table designating valid device structures for a fabrication process is received in the computing apparatus. Device structures in the device layout file are designated as supported device structures by comparing the device structures in the device layout file to the valid device structures in the foundry truth table using the computing apparatus. Device structures in the device layout file that do not correspond to valid device structures for the fabrication process are designated as unsupported devices using the computing apparatus. A list of the unsupported device structures is generated using the computing apparatus.

10 Claims, 7 Drawing Sheets

IDENTIFICATION OF ILLEGAL DEVICES USING CONTACT MAPPING

CROSS-REFERENCE TO RELATED APPLICATIONS

Not applicable.

BACKGROUND

The disclosed subject matter relates generally to manufacturing and, more particularly, to the identification of illegal devices using contact mapping.

In the semiconductor industry many device designers outsource the actual device fabrication process. These designers are referred to as fab-less companies. In some cases, the designer may bid the fabrication process to multiple fabrication foundries. A common problem faced by foundries that manufacture the semiconductor devices is to ensure that the device structures contained in a layout database sent by a customer are actually supported by the current process used by the foundry. Due to late process changes, support for certain device structures might have ended, while the customer layout was not updated accordingly to account for this fact. Also, in the case where a customer is dealing with more than one foundry, the device structures supported by the processes of the different foundries may differ.

If such a layout were to be fabricated, a non-functional device may result from the non-supported device structures. Standard methodology to detect illegal device structures is to use Layout-vs-Schematic (LVS) software to compare the logic design to the layout data. The LVS review compares the schematic netlist and the layout file to determine whether the integrated circuit layout corresponds to the original schematic of the design. In general, LVS employs equivalence checking, which checks whether two circuits perform the exact same function without demanding exact equivalency. The LVS verification process recognizes the drawn shapes in the layout that represent the electrical components of the circuit, as well as the connections between them. The derived electrical components are compared to the schematic netlist to identify errors.

However, because customers do not reveal the schematic to the foundry, the foundry is not able to run LVS on customer designs. Moreover, if the customer uses a foundry as a second source supplier, the customer is usually not willing to rerun physical verification for the second source foundry, as it is expected that the second source foundry matches the process with the first source foundry.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for identifying unsupported device structures. The method includes receiving a device layout file in a computing apparatus defining a plurality of device structures in a semiconductor device. A foundry truth table designating valid device structures for a fabrication process is received in the computing apparatus. Device structures in the device layout file are designated as supported device structures by comparing the device structures in the device layout file to the valid device structures in the foundry truth table using the computing apparatus. Device structures in the device layout file that do not correspond to valid device structures for the fabrication process are designated as unsupported devices using the computing apparatus. A list of the unsupported device structures is generated using the computing apparatus.

Another aspect of the disclosed subject matter is seen in a non-transitory program storage device programmed with instructions, that when executed by a computing apparatus perform a method. The method includes receiving a device layout file in the computing apparatus defining a plurality of device structures in a semiconductor device, receiving a foundry truth table designating valid device structures for a fabrication process in the computing apparatus, designating device structures in the device layout file as supported device structures by comparing the device structures in the device layout file to the valid device structures in the foundry truth table using the computing apparatus, designating device structures in the device layout file that do not correspond to valid device structures for the fabrication process as unsupported devices using the computing apparatus, and generating a list of the unsupported device structures using the computing apparatus.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
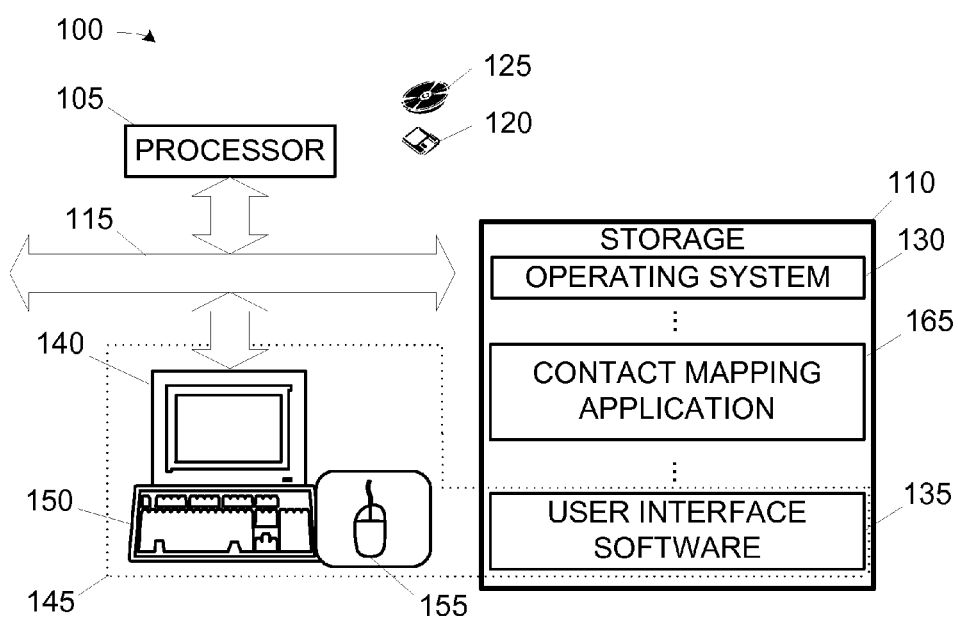
FIG. 1 is a simplified block diagram of an illustrative computing apparatus for identifying unsupported device structures in a semiconductor device layout in accordance with one aspect of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present subject matter shall be described in the context of an illustrative computing apparatus 100 for identifying unsupported device structures in a semiconductor device layout. The computing apparatus 100 includes a processor 105 communicating with storage 110 over a bus system 115. The storage 110 may include a hard disk and/or random access memory ("RAM") and/or removable storage, such as a magnetic disk 120 or an optical disk 125. The storage 110 is also encoded with an operating system 130, user interface software 135, and a contact mapping application 165. The user interface software 135, in conjunction with a display 140, implements a user interface 145. The user interface 145 may include peripheral I/O devices such as a keypad or keyboard 150, mouse 155, etc. The processor 105 runs under the control of the operating system 130, which may be practically any operating system known in the art. The contact mapping application 165 is invoked by the operating system 130 upon power up, reset, user interaction, etc., depending on the implementation of the operating system 130. The contact mapping application 165, when invoked, performs a method of the present subject matter for identifying unsupported device structures in a semiconductor device layout. The user may invoke the contact mapping application 165 in conventional fashion through the user interface 145. Note that although a stand-alone system is illustrated, there is no need for the data to reside on the same computing apparatus 100 as the contact mapping application 165 by which it is processed. Some embodiments of the present subject matter may therefore be implemented on a distributed computing system with distributed storage and/or processing capabilities.

It is contemplated that, in some embodiments, the contact mapping application 165 may be executed by the computing apparatus 100 to implement one or more functions described hereinafter to identify unsupported device structures. Data for the contact mapping may be stored on a computer readable storage device (e.g., storage 110, disks 120, 125, solid state storage, and the like).

Portions of the subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 2:
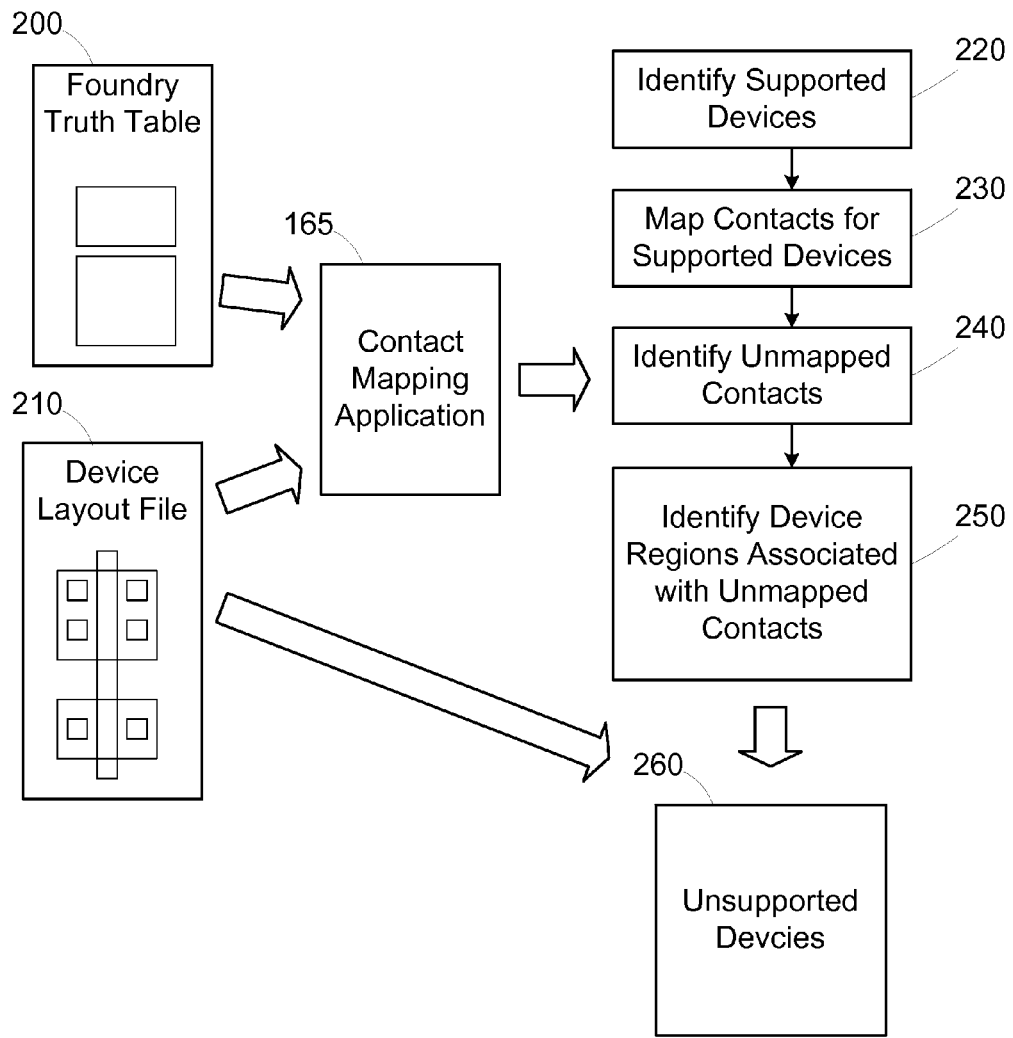
FIG. 2 is a flow diagram of a process used by the contact mapping application of FIG. 1.

A general process flow for the computing apparatus 100 in implementing the functions of the contact mapping application 165 is shown in FIG. 2. Inputs to the contact mapping application 165 include a foundry truth table 200 that includes a list of the valid device structures supported by the foundry and their associated layouts and a device layout file 210 that defines how the device structures in the semiconductor device being evaluated are to be physically implemented in silicon.

Figure 3:
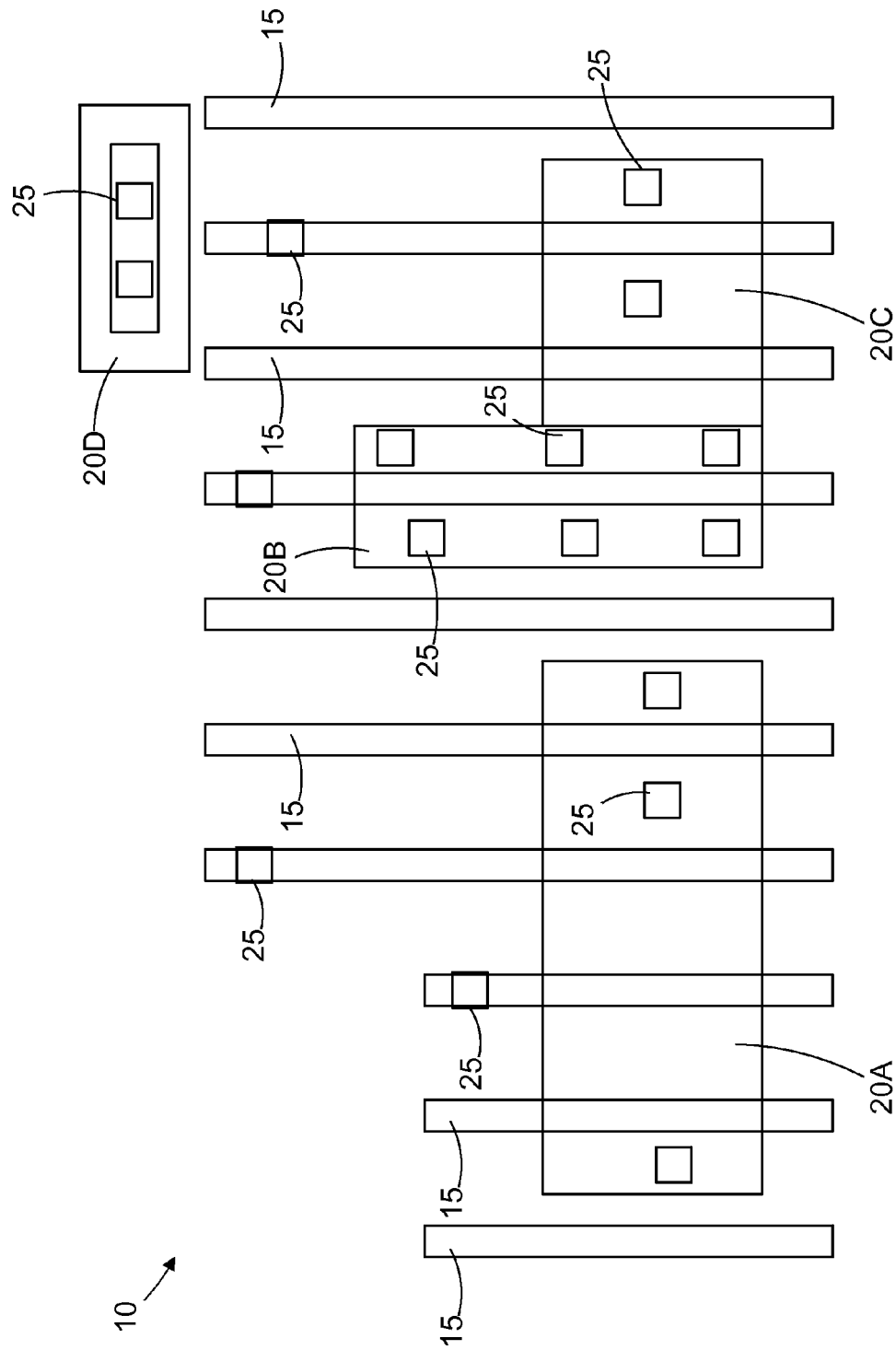
FIGS. 3-7 are device layout diagrams used to illustrate the operation of the contact mapping application of FIG. 1 in accordance with the process flow of FIG. 2.

The process used by the contact mapping application 165 is described by the method flow of FIG. 2 and the device diagrams of FIGS. 3-7. FIG. 3 illustrates a portion of the device layout file 210. The device layout file 210 specifies the various physical features of the device on the multiple layers of the device. As illustrated in FIG. 3, the device layout file 210 defines device features 20A-D in one or more device layers. In the illustrated embodiment, the device structures may be transistors, doped wells, memory cells, etc. Lines 15 are defined in a layer above the device features 20A-D, and contacts 25 are defined that connect to the lines 15 or the regions 20A, 20B, 20C. In the context of a field effect transistor, the regions 20A, 20B, 20C may be diffusion regions (e.g., doped silicon) in a semiconductor layer, and the lines 15 may be gate electrodes or conductive lines (e.g., polysilicon).

The contacts 25 may connect the diffusion regions and the gate electrodes to higher level interconnect layers of the device.

Figure 4:
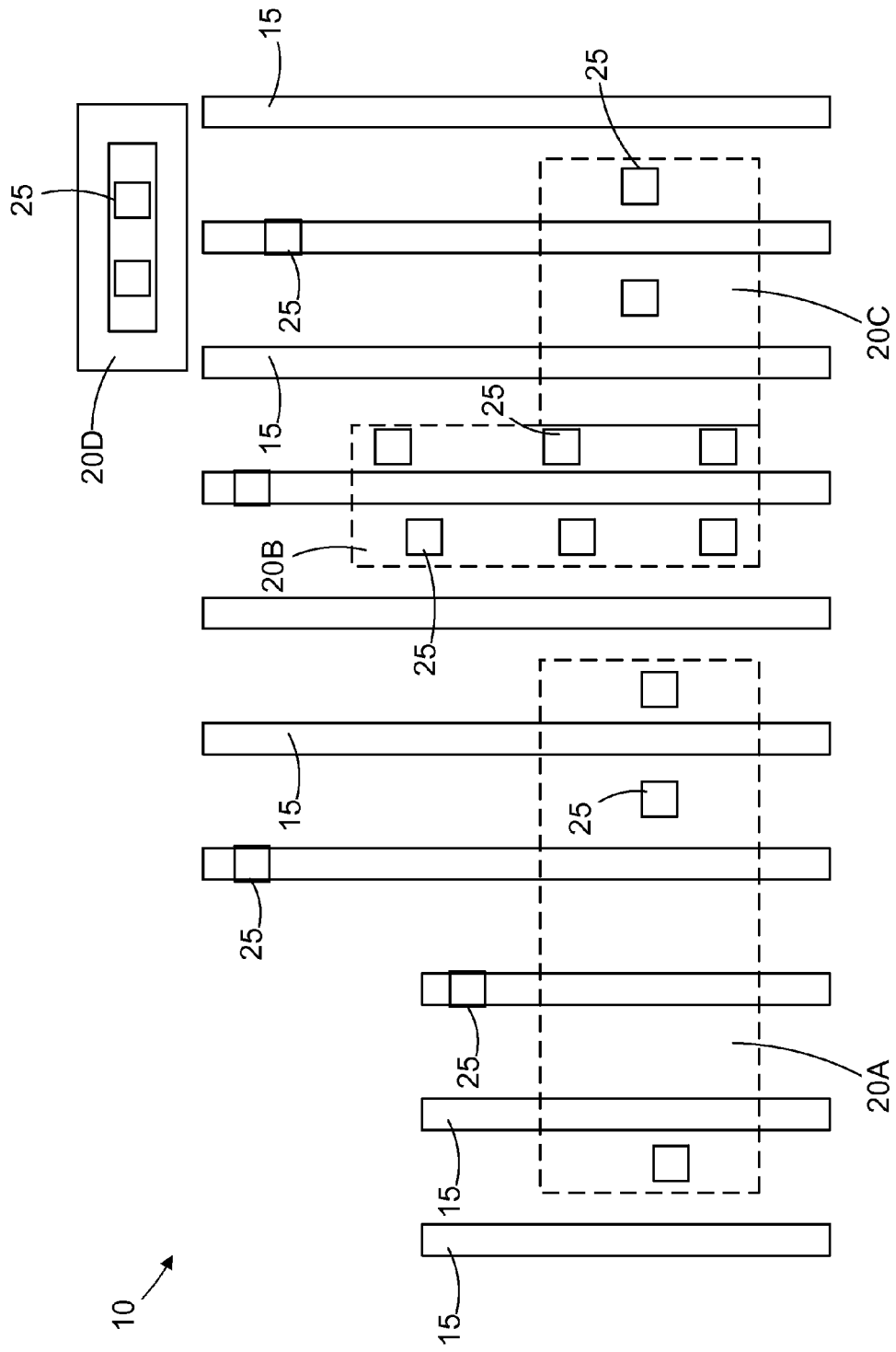

In block 220 of FIG. 2, the contact mapping application 165 identifies supported device structures using the foundry truth table 200. The supported device structures are identified by matching the structures in the device layout file 210 with valid device structures defined in the foundry truth table 200. Generally, a geometric pattern matching technique may be used to determine if a valid device in the foundry truth table 200 matches a particular device 20A-D in the device layout file 210. As illustrated in FIG. 4, the device structures 20A, 20B, and 20C have matching valid device structures in the foundry truth table 200, so they are flagged as being supported device structures, as indicated by the dashed lines surrounding the device structures 20A, 20B, 20C. In the illustrated embodiment, the matching between the device layout file 210 and the foundry truth table 200 may be implemented using Calibre SVRF (Standard Rule Verification Format) code offered commercially by Mentor Graphics of Wilsonville, Oreg. This language provides for layout geometry queries and checks.

Figure 5:
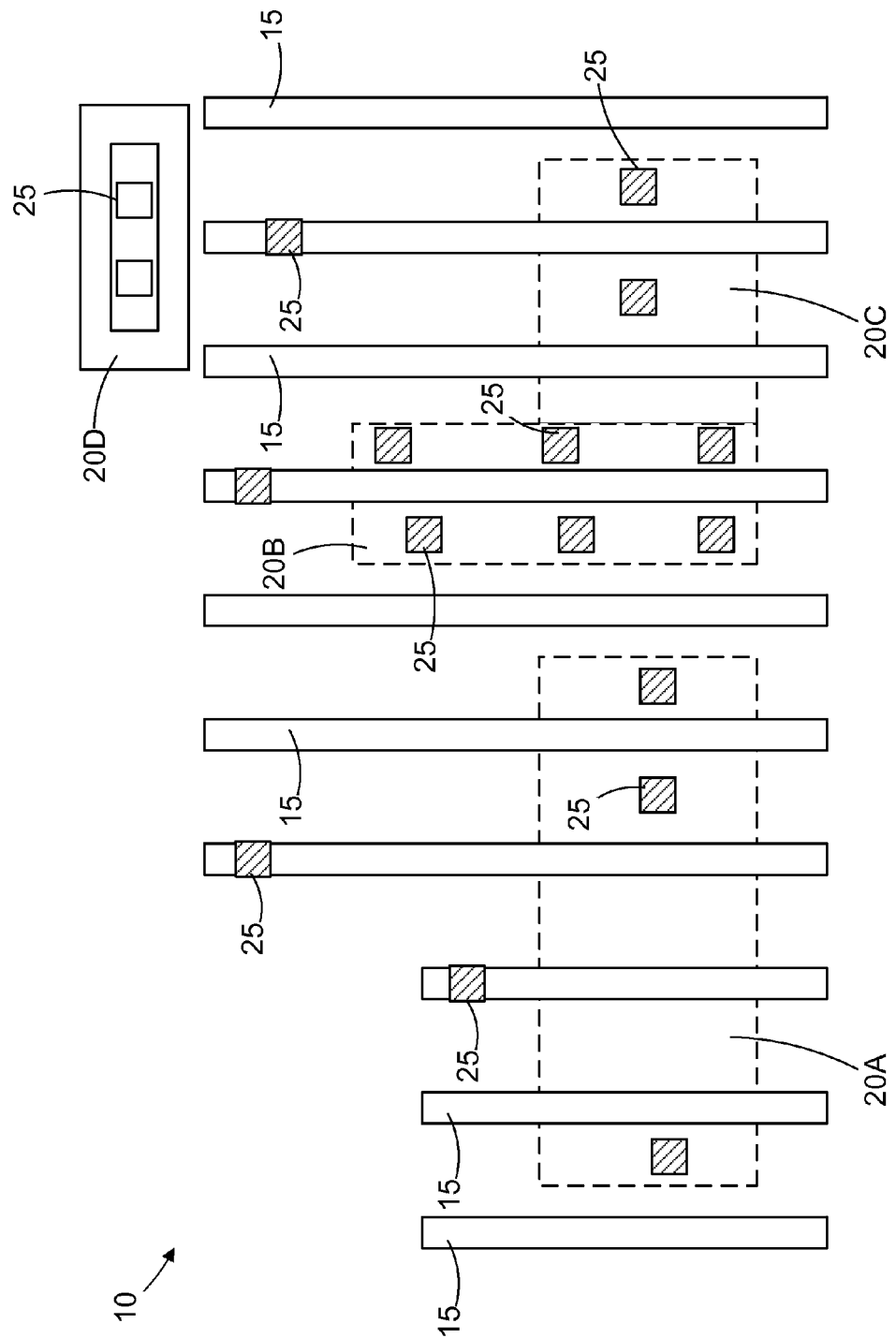
Figure 6:
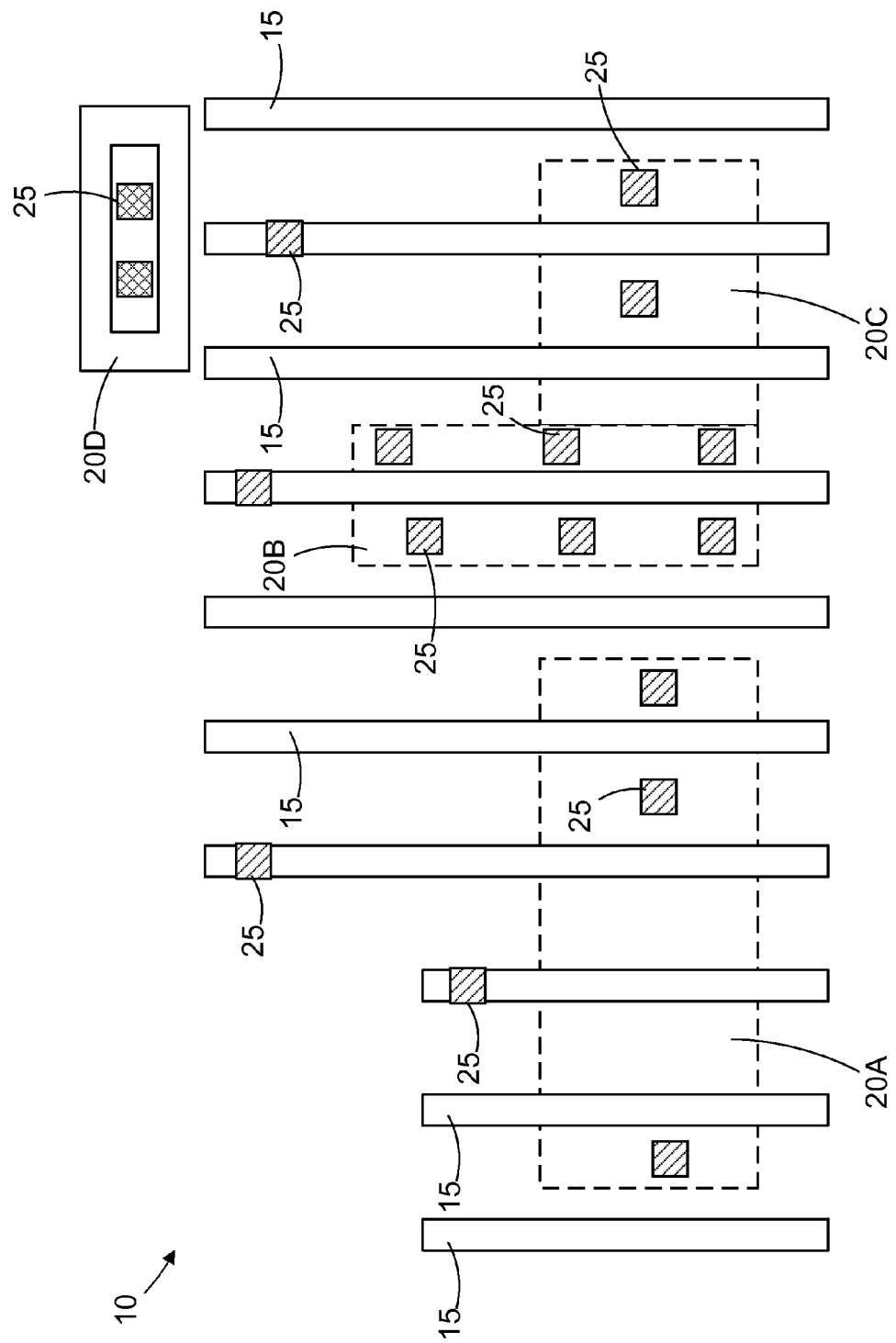

In method block 230, the contacts 25 associated with the supported device structures 20A, 20B, 20C are identified. As illustrated in FIG. 5, the contacts 25 associated with the supported device structures 20A, 20B, 20C are designated as being mapped to valid device structures. In method block 240, the unmapped contacts 25 are identified. As illustrated in FIG. 6, the unmapped contacts 25 are flagged.

Figure 7:
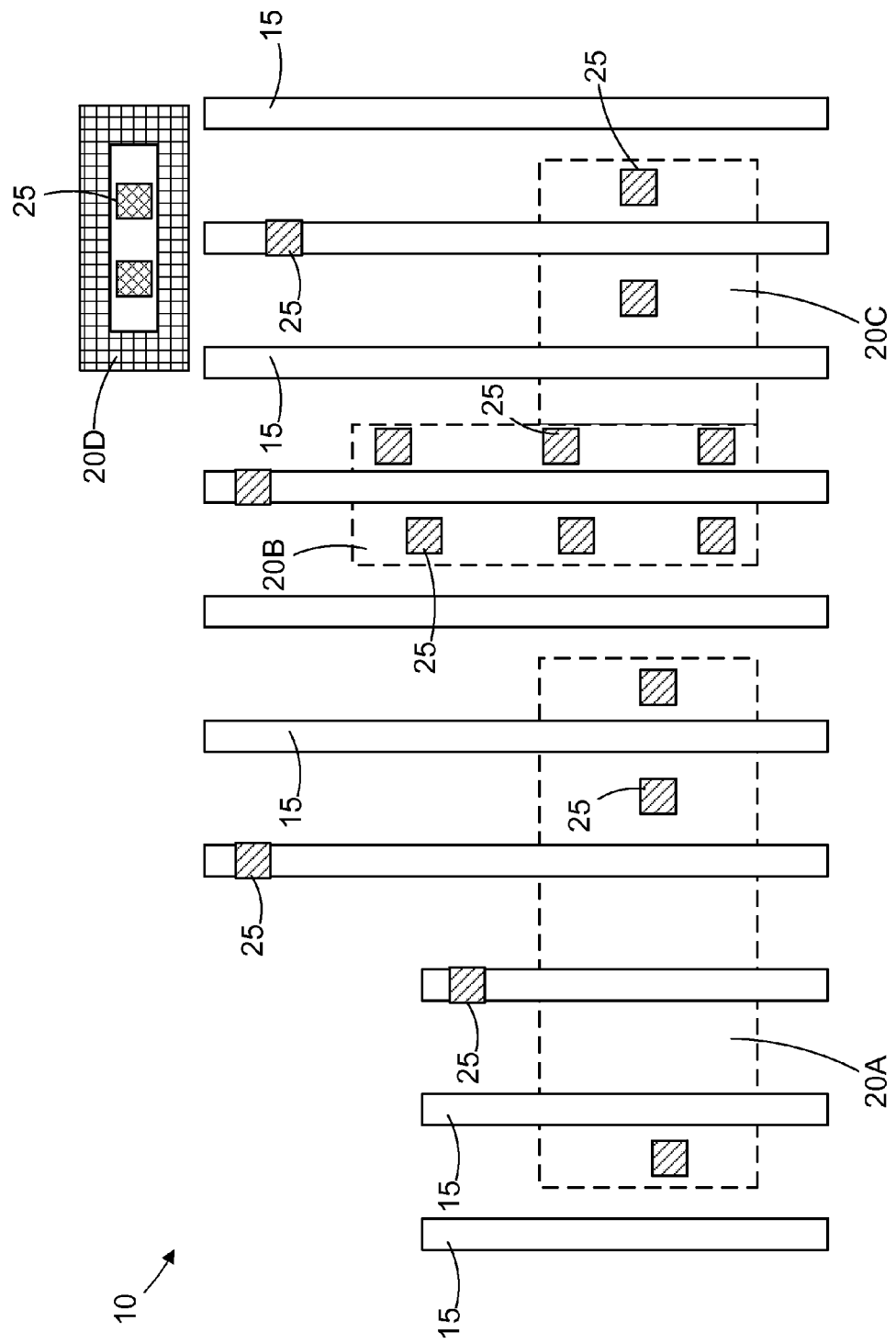

In method block 250, the device regions, such as device region 20D, that are associated with the unmapped contacts 25 are flagged as being unsupported device structures. FIG. 7 illustrates the identification of the unsupported device structure 20D.

The contact mapping application 165 generates a list 260 of unsupported device structures present in the device layout file 210. The list 260 of unsupported device structures may be used by the fabricator to approach the customer to rectify the error in the design. For example, new device structures may be defined in the foundry truth table 200 corresponding to the identified unsupported device structures. Alternatively, the unsupported device structures may be modified so that they perform the same function, but have structure matching an entry in the foundry truth table 200. The unsupported device structure list may also be provided to the customer to indicate the device structures that would not likely be functional if the process supported by the fabricator were used to fabricate the semiconductor device associated with the device layout file 210.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

I claim:

1. A method, comprising:
   receiving a device layout file in a computing apparatus defining a plurality of device structures in a semiconductor device;
   receiving a foundry truth table designating valid device structures for a fabrication process in the computing apparatus;
   designating device structures in the device layout file as supported device structures by comparing the device structures in the device layout file to the valid device structures in the foundry truth table using the computing apparatus;
   designating device structures in the device layout file that do not correspond to valid device structures for the fabrication process as unsupported devices using the computing apparatus; and
   generating a list of the unsupported device structures using the computing apparatus.

2. The method of claim 1, wherein designating device structures in the device layout file as supported device structures comprises performing a geometric pattern match between the valid device structures in the foundry truth table and the device layout file.

3. The method of claim 1, further comprising:
   identifying contacts associated with the supported device structures as mapped contacts;
   identifying contacts not associated with a supported device structure as unmapped contacts; and
   designating device structures associated with the unmapped contacts as unsupported device structures.

4. The method of claim 3, wherein the device structures in the device layout file comprise diffusion regions in a semiconductor layer and conductive lines interfacing with the diffusion regions, and identifying contacts associated with the supported device structures comprises identifying contacts interfacing with the diffusion regions or conductive lines of the supported device structures.

5. The method of claim 1, wherein the device structures in the device layout file comprise diffusion regions in a semiconductor layer.

6. The method of claim 5, wherein the device structures in the device layout file comprise conductive lines interfacing with the diffusion regions.

7. A non-transitory program storage device programmed with instructions, that when executed by a computing apparatus perform a method, the method comprising:
   receiving a device layout file in the computing apparatus defining a plurality of device structures in a semiconductor device;
   receiving a foundry truth table designating valid device structures for a fabrication process in the computing apparatus;
   designating device structures in the device layout file as supported device structures by comparing the device structures in the device layout file to the valid device structures in the foundry truth table using the computing apparatus;
   designating device structures in the device layout file that do not correspond to valid device structures for the fabrication process as unsupported devices using the computing apparatus; and
   generating a list of the unsupported device structures using the computing apparatus.

8. The program storage device of claim 7, wherein designating device structures in the device layout file as supported device structures in the method comprises performing a geometric pattern match between the valid device structures in the foundry truth table and the device layout file.

9. The program storage device of claim 7, wherein the method further comprises:

identifying contacts associated with the supported device structures as mapped contacts;

identifying contacts not associated with a supported device structure as unmapped contacts; and designating device structures associated with the unmapped contacts as unsupported device structures.

10. The program storage device of claim 9, wherein the device structures in the device layout file comprise diffusion regions in a semiconductor layer and conductive lines interfacing with the diffusion regions, and identifying contacts associated with the supported device structures in the method comprises identifying contacts interfacing with the diffusion regions or conductive lines of the supported device structures.

* * * * *